United States Patent
Vallencourt

[11] Patent Number: 6,121,836
[45] Date of Patent: Sep. 19, 2000

[54] DIFFERENTIAL AMPLIFIER

[75] Inventor: David Gerard Vallencourt, Middletown, N.J.

[73] Assignee: Lucent Technologies, Murray Hill, N.J.

[21] Appl. No.: 09/074,887

[22] Filed: May 8, 1998

[51] Int. Cl.[7] .................................................. H03F 3/45
[52] U.S. Cl. ........................................... 330/253; 330/258
[58] Field of Search ...................................... 330/253, 258, 330/257, 252

[56] References Cited

U.S. PATENT DOCUMENTS

| | | | |
|---|---|---|---|
| 5,515,003 | 5/1996 | Kimura | 330/253 |
| 5,608,352 | 3/1997 | Itakura | 330/253 |
| 5,650,753 | 7/1997 | Ling | 330/253 |
| 5,739,722 | 4/1998 | Ling | 330/253 |
| 5,854,574 | 12/1998 | Singer et al. | 330/253 |

*Primary Examiner*—Robert Pascal
*Assistant Examiner*—Khanh Van Nguyen

[57] ABSTRACT

A differential amplifier that includes both a main differential pair of transistors and an auxiliary differential pair of transistors of like conductivity type that are operated in a complementary mode with respect to the main differential pair. A monitoring circuit measures the current to the load from the main pair and varies the current to the load from the auxiliary pair to keep the total current to the load substantially constant, as the common-mode amplitude of the input differential signal varies. This serves to increase the effective dynamic range of the differential amplifier.

15 Claims, 3 Drawing Sheets

DIFFERENTIAL AMPLIFIER

FIELD OF THE INVENTION

The invention relates to differential amplifiers and more particularly to such amplifiers that have an extended common-mode operating range.

BACKGROUND OF THE INVENTION

Differential amplifiers are a popular form of amplifier and are especially useful in analog circuits where they are commonly used as a current mirror and the input stage of operational amplifiers.

A problem with the basic prior art form of differential amplifier is that it tends to have a relatively narrow common-mode operating range that is limited to a fraction of the voltage difference between the $V_{DD}$ and the $V_{SS}$ power supply rails of the amplifier circuit.

This limit arises because this form of differential amplifier will not operate properly with a common-mode voltage $V_{CM}$ of magnitude less than that sufficient to sustain the sum of the gate-to-source voltage $V_{GS}$ of the input transistors plus the drain-to-source saturation voltage $V_{DS}$ of the tail current source. In particular, this differential amplifier will not function if $$V_{CM} > V_{DD} - V_{DS\ MIN} - V_{GS}$$

where $V_{DS\ MIN}$ is the minimum allowable drain-to-source voltage of the tail current source necessary to keep the amplifier in saturation. The aim generally with respect to a differential amplifier is to permit satisfactory operation up to a value of $V_{CM}$ close to that of $V_{DD}$, thereby to maximize the operating range, and thus the dynamic range, of the amplifier.

The usual approach to a solution of this problem is to add a second input pair stage, in parallel with the first input pair stage, the second stage being of transistors of the type complementary to those in the first stage, e.g., the first input stage using transistors of p-type and the second input stage using transistors of n-type. Each stage covers a portion of the input common-mode range with the PMOS input stage working down to the lower voltage supply rail $V_{SS}$ and the NMOS input stage working up to the higher voltage supply rail $V_{DD}$. Various schemes have been devised for transforming bias current from one stage to the other stage to minimize the change in the composite transconductance of the two stages. A widely varying composite transconductance is generally undesirable because it creates difficulty in achieving the desired compensation and design results of the complete amplifier. However, such approaches, for success, depend heavily on well-controlled relationships between the characteristics of the NMOS and PMOS devices, which are difficult to realize in practice without a large increase in the manufacturing costs. The present invention involves a different approach.

SUMMARY OF THE INVENTION

The present invention avoids the problem discussed by using as a second input stage, or auxiliary differential pair, a pair of transistors of the same conductivity type as the pair of the first input stage, or main differential pair, with the input voltages to each of the second pair being arranged to be shifted in d-c level with respect to the common mode voltage to the input voltages applied to the first pair, and with the output drains of the second stage tied to the output drains of the first pair for supplying the load. By appropriate control of the tail current source of the second pair to maintain the total current to the load essentially constant, the useful operating range of the common-mode voltage is extended essentially to the voltage difference between the positive and negative rails of the voltage supply. Advantageously, the second input pair of voltages is supplied by a pair of transistors that are of the conductivity type opposite that of the first and second pairs and that are connected as source followers.

In one illustrative embodiment, the control is established by providing essentially a copy of the first (main) input stage for measuring the current in the first input stage and using the measured current to divert current from the second (auxiliary) input stage to maintain essentially constant the total current provided by the two stages to the load.

In another illustrative embodiment, the control is established by providing a scaled-down copy of the main stage and using the scaled current to divert current from the auxiliary stage to maintain essentially constant the total current provided by the main and auxiliary stages to the load.

From another aspect, the invention is a method for amplifying a first pair of differential signals comprising the steps of applying the differential signals at different d-c levels from to first and second differential amplifiers of transistors of like conductivity type whose output signals are combined in common load, measuring the output current of the first differential amplifier in a copy of the first differential amplifier, and using the measured current for controlling the output current of the second differential amplifier for maintaining constant the combined current to the load.

The invention will be better understood from the subsequent more detailed description taken in conjunction with the accompanying drawing.

DETAILED DESCRIPTION

Figure 1:
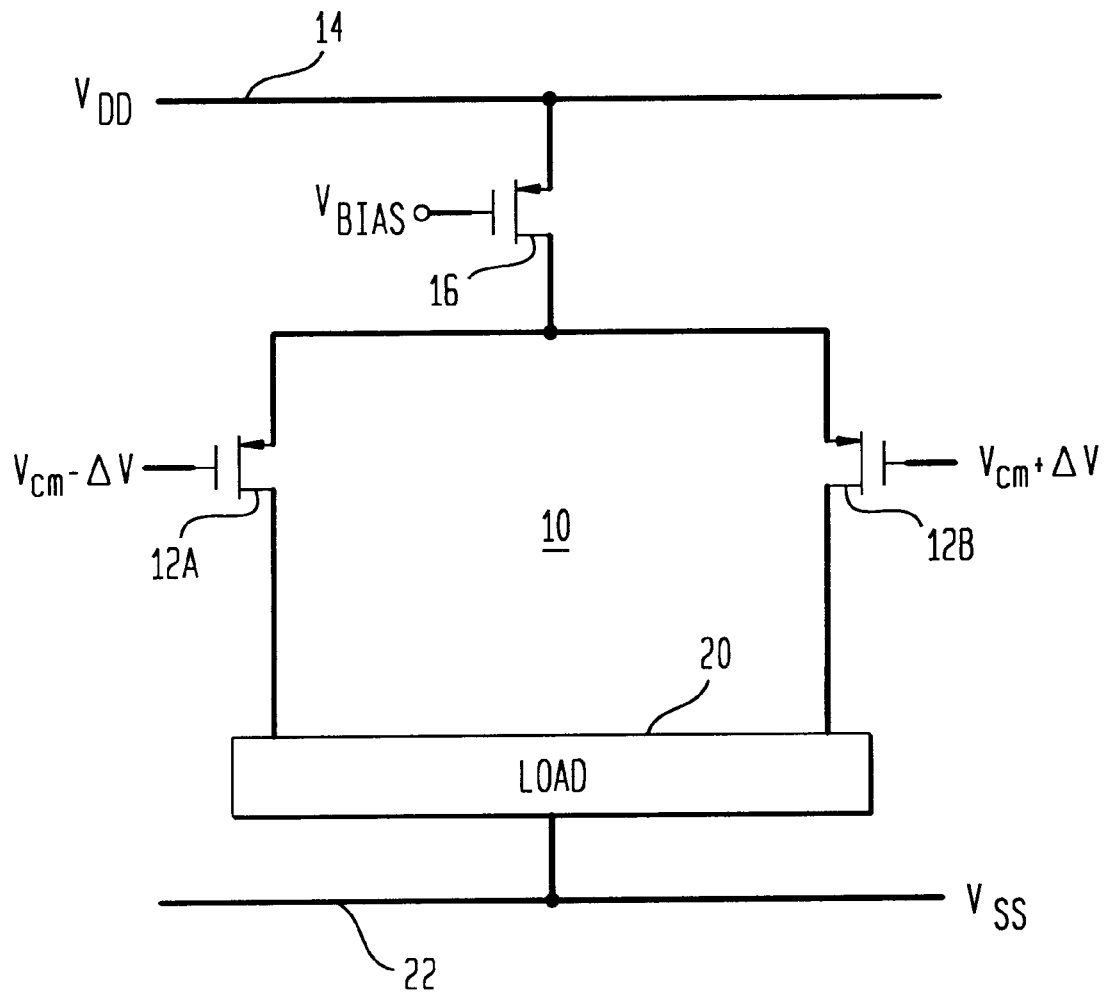
FIG. 1 is a circuit schematic of the basic form of differential amplifier of the prior art.

With reference now to the drawing, FIG. 1 shows the basic form of prior art differential amplifier 10 of the sort that the invention serves to improve.

The amplifier comprises the pair of P-channel MOSFETs 12A and 12B whose sources are tied together and then to the $V_{DD}$ positive voltage supply rail 14 by way of the current source p-channel MOSFET 16 whose gate is tied to a bias source $V_{BIAS}$. The drains of transistors 12A and 12B supply the load 20, typically an active load, such as a current mirror. This is connected to the $V_{SS}$ negative voltage supply rail 22; the two differential signals $V_{CM}-\Delta V$ and $V_{CM}+\Delta V$ are applied to the gates of transistors 12A and 12B and the voltage difference in the two signals acts to divide correspondingly the current provided by the current source 16 between the two transistors 12A and 12B. As has been mentioned above, if the common-mode input voltage is excessive the amplifier will not function because there will be insufficient drain-to-source voltage across the current source 16 for it to keep in saturation, as is important for the amplifier to operate as intended.

Also as discussed above, the usual solution has been to employ two input stages, essentially in parallel, one using a differential pair of p-channel transistors, the other using a differential pair of n-channel transistors, with each pair covering a different portion of the input common-mode range. However, for linear amplification over the operating range, as is generally important in analog amplifiers, it becomes necessary to match closely the amplifying characteristics of the n-type and p-type transistors, which can be difficult and increases the cost of the amplifier.

This is especially difficult when the power supply voltage is comparable to the threshold voltage of the transistors being used in the amplifier, as for example when the power supply voltage is one volt, as has now become common, and the transistors have a threshold voltage of one half volt. The present invention is of particular importance in such a situation.

Figure 2:
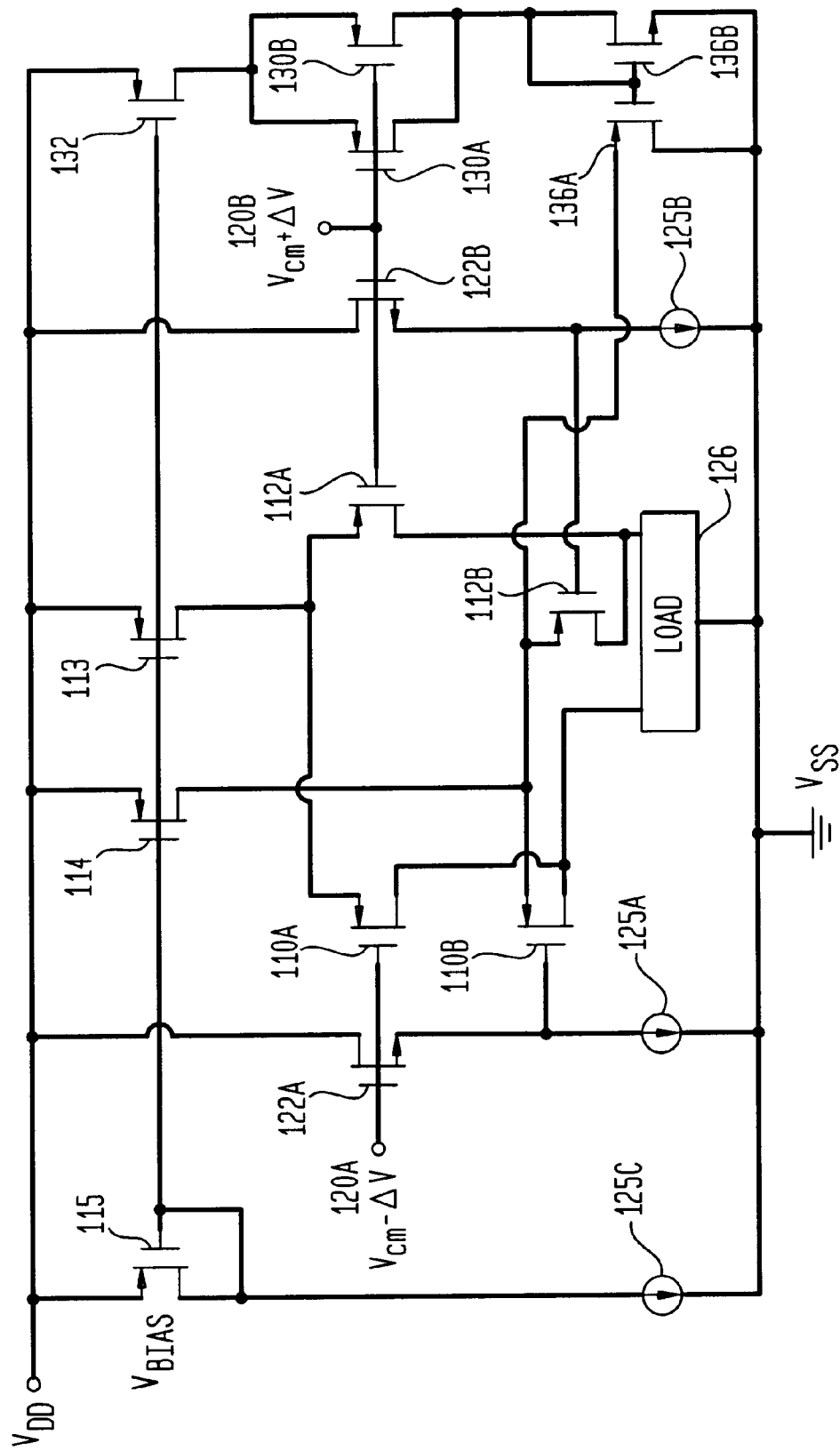
FIG. 2 and FIG. 3 are circuit schematics of two exemplary differential amplifiers in accordance with the invention.

In accordance with the present invention, the limitation discussed of the basic amplifier is overcome in an amplifier 100 of the kind illustrated in FIG. 2.

This amplifier 100 includes a first input stage provided by the main differential transistor pair 110A, 112A, illustratively P-MOSFETs, that corresponds to the differential transistor pair of the basic amplifier. This differential pair of transistors have their sources connected to the positive voltage supply rail $V_{DD}$ by way of the p-type current source 113.

There is also included as the second input stage an auxiliary differential P-MOSFET transistor pair 110B, 112B, matched to the main pair 110A, 112A, the drain of transistor 110B being connected to the drain of transistor 110A and the drain of transistor 112B connected to the drain of transistor 112A. The sources of transistors 110A and 112A are connected together and to the positive supply voltage rail $V_{DD}$ by way of the p-type current source 114. The gate of transistor 110A is supplied with the voltage $V_{CM}-\Delta V$ directly from the first input terminal 120A and the gate of transistor 112A is supplied with the differential voltage $V_{CM}+\Delta V$ directly from the second input terminal 120B. The gate of the transistor 110B is supplied by the first input terminal 120A indirectly by way of the N-MOSFET 122A that is connected as a source follower with its gate also connected to input terminal 120A. The role of the source follower is to shift downward the d-c level of the input signal to permit use of a wider portion of the common mode operating voltage range. The gate of the transistor 112A is supplied by the second input terminal 120B indirectly by way of the N-MOSFET 122B that is also connected as a source follower with its gate connected to the second input terminal 120B. The drains of MOSFETs 122A and 122B are each connected to the positive voltage supply rail $V_{DD}$ and their respective sources are connected to the gates of transistors 110B and 112B, respectively, and by way of current sources 125A and 125B, respectively, to the negative voltage supply rail $V_{SS}$, which typically is ground, as shown in FIG. 2. The respective drains of transistors 110B and 112B are connected to the drains of transistors 110A and 112A, respectively, and to the two differential outputs that supply the load 126, which is typically a current mirror supplying an operational amplifier.

The part of the circuit described up to this point basically comprises a matched pair of differential amplifiers connected and operated such that each pair operates in a different portion of the input common mode voltage range because of the d-c shift introduced by the source followers 122A, 122B. There remains the problem of transferring bias current from one stage to the other so as to minimize the change in composite transconductance of the two stages over the full operating range.

When the voltage $V_{CM}$ is large enough, the main transistors 110A and 112A tend to shut off as their tail current provided by current source 113A decreases. If the D-C voltage shift provided by the source followers 122A and 122B is large enough, the transistors 110B and 112B of the auxiliary input pair will not suffer the same problem and should continue to operate as an input differential amplifier up to $V_{CM}$ equal to $V_{DD}$.

It should be noted that this circuit arrangement has the following properties. At $V_{DD}$ equal to one volt, and with all the transistors exhibiting threshold voltages in the range of about 0.3V–0.5V, the circuit can easily be constructed to satisfy the level shift criterion set forth above, and in fact can operate with a rail-to-rail voltage equal to $V_{CM}$. This is important because an important application of the invention is expected to involve operation with a one volt voltage supply. Moreover, the range of threshold voltages mentioned above is currently standard in the integrated circuit fabrication technologies for devices designed to be operated with one volt supply voltage.

Additionally, the "load" 126 shown in the drawing may represent not only the load of the input stage of the operational amplifier but also the rest of the circuitry of the amplifier, including subsequent stages. With proper control of the tail current, the load never is affected by the input auxiliary pair, and so any differential amplifier, even one designed without consideration of the rail-to-rail input capability, can be retrofitted in this manner without modification.

To this end, the load and subsequent circuits will not experience any change in the D-C bias condition if the sum of the currents through the 110A, 110B, 112A, 112B input devices remains constant over the $V_{CM}$ range. One way this can be achieved is as follows. First there can be left unchanged the original input stage consisting of transistors 110A, 112A and its tail current source transistor 113A. Next there is provided an approximate copy of the original input stage for use in measuring the current delivered by the original input tail current source 113A as $V_{CM}$ changes. Finally there is biased the auxiliary input stage consisting of transistors 110B and 112B with the difference between the nominal bias current of the original input stage and the current measured by the copy circuit. This means that above $V_{CM}=0$, the original input stage of 110A and 110B would be acting at full bias, for example with the current $I_O$ provided by the master tail current source 115. As $V_{CM}$ rises, this tail current would tend to drop to $I_O-f(V_{CM})$ where $f(V_{CM})$ is the change in the tail current as $V_{CM}$ varies.

The additional portion of the circuit of FIG. 2 is one illustrative technique for achieving the effects discussed. First there is added the path between $V_{DD}$ and $V_{SS}$ comprising P-MOSFETs 130A and 130B connected in parallel. The sources of transistors 130A and 130B are tied together and to the positive voltage supply rail $V_{DD}$ by way of tail current source 132. The drains of transistors 130A and 130B are tied together and by way of a current mirror to the negative voltage supply rail $V_{SS}$. The current mirror is formed by N-MOSFET transistors 136A and 136B. The gates of the P-MOSFET transistors 130A and 130B are each supplied by the signal from an input terminal, for example terminal 120B. A more exact copy would be provided by applying separate signals from input terminals 120A and 120B to the gates of transistors 136A, 136B, respectively. However $\Delta V$ is generally small compared to $V_{CM}$. Accordingly, for use in the measuring circuit of the invention, either one of the signals on input terminals 120A–120B may be used in place of the two separate signals supplied to transistors 110A, 112A, as is done in this example. The current mirror mentioned operates by first charging the capacitor formed by the shorted gate-drain of transistor 136B with the current provided by transistors 130A, 130B and then transferring the resulting voltage to transistor 136A. The transistor 136A serves as a secondary current source for the auxiliary differential pair formed by transistors 110B, 112B. To the extent that the current to the load 126 from the main differential pair of transistors 110A, 110B increases, the current through the pair 130A, 130B also increases, and the more the current provided by the current source 114 is diverted from flow to the load through the auxiliary differential pair of transistors 110B, 112B for flow instead through transistor 136A to the negative voltage rail $V_{SS}$. Conversely, to the extent that the current through the main pair of transistors 110A, 112A decreases, the less current is diverted from flow through the auxiliary transistors 110B, 112B to the load. As a result, the current flow to the load remains essentially constant, as is desired.

Advantageously for the most linear response, the amplifier transistors 110A, 110B, 112A, 112B, 130A and 130B are all matched to have similar current characteristics. Similarly, for a linear response the transistors 113, 114, 115 and 132 used as current sources, advantageously are all matched with one another.

The transconductance of the composite input stage formed by transistors 110A, 110B and 112A and 112B will vary, when operated as described, from a minimum value equal to the transconductance of either the 110A, 110B side alone, to a maximum corresponding to the operating point when both sides are operating at half the nominal bias current.

Figure 3:
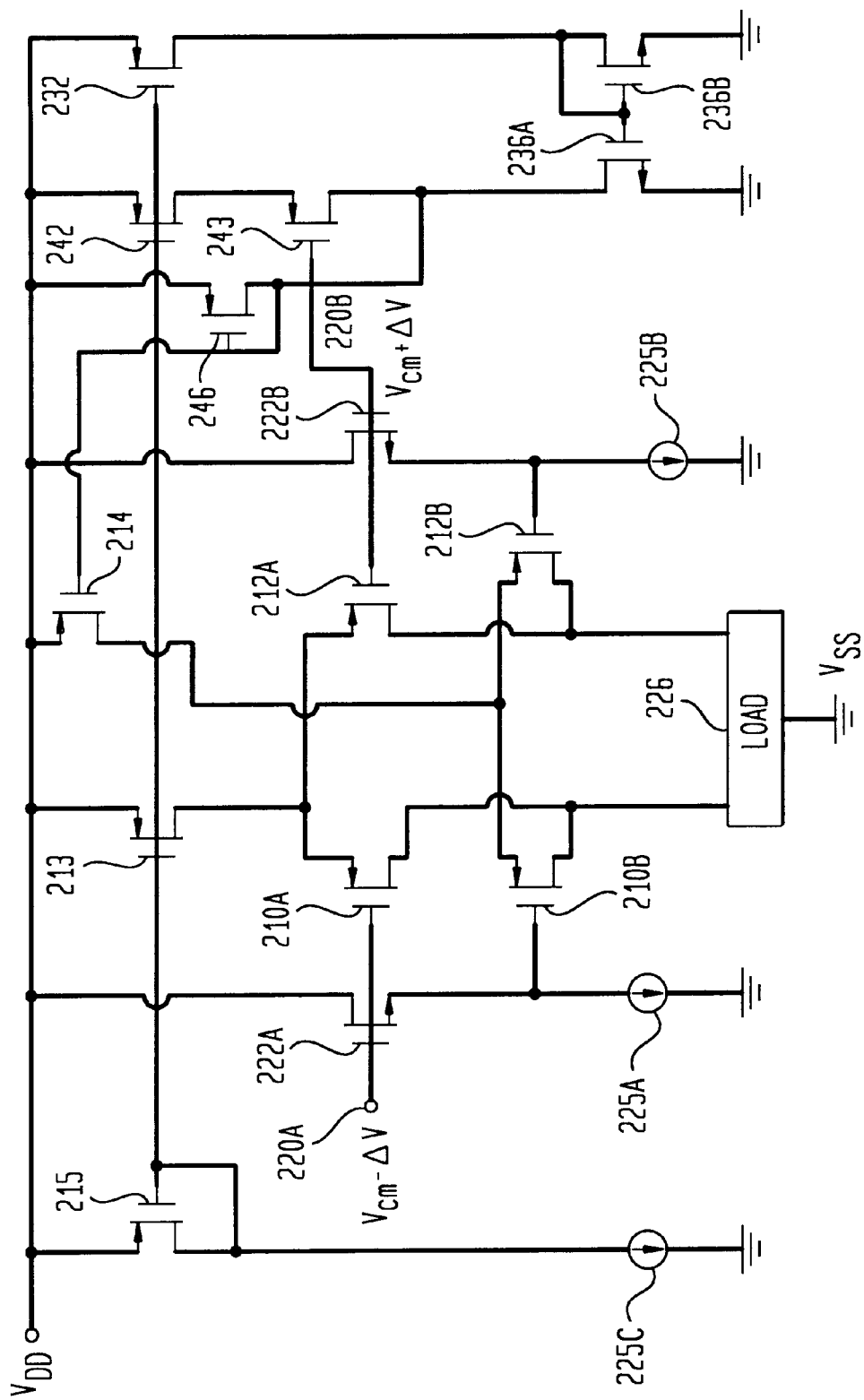

In the embodiment 100 shown in FIG. 2, each of the circuits of the main differential pair, of the auxiliary differential pair, and of the monitoring circuit can on occasion be drawing essentially the entire nominal bias current Io, although much of it is being diverted away from the load and so is essentially being wasted. FIG. 3 shows a differential amplifier 200 that uses current more efficiently, particularly the current used for the monitoring circuit. The saving is accomplished by using a scaled down version of the main circuit for monitoring the current flowing in the main circuit. The scaling is by a factor of 1/N, where N typically is four.

In the amplifier 200 shown in FIG. 3, the various elements that correspond to elements in the embodiment of FIG. 2 have been given reference numerals increased by one hundred with respect to those used in FIG. 2. Unless indicated otherwise, corresponding elements in the two embodiments are operated in essentially the same manner.

In the differential amplifier 200, the main circuit comprises the differential pair 210A, 212A whose source electrodes are each connected to the tail current source 213, whose gates are connected to input terminals 220A, 220B, respectively and whose drain electrodes are connected to the load 226.

The auxiliary circuit includes the differential pair 210B, 212B whose source electrodes are connected to the tail current source 214. The gate of current source 214 is now connected to the gate and drain of the scaled P-MOSFET 246 whose source electrode is connected to $V_{DD}$. The gate and drain electrode of transistor 246 are connected to the juncture between the drain of the N-MOSFET 236A, which is part of a current mirror, and the drain of P-MOSFET 243, which is part of the monitoring circuit, as will be described in more detail later. The monitoring circuit includes the scaled tail current source 232 whose source electrode is connected to the voltage supply $V_{DD}$ and whose gate is connected to the main current source 215. The drain of transistor 232 is connected to the drain of N-MOSFET 236B whose source is connected to $V_{SS}$ and whose gate is connected both to its drain and to the gate of N-MOSFET 236A. The source electrode of transistor 236A is connected to $V_{SS}$ and its drain electrode is connected to the gate of the tail current source 214, as previously mentioned. Also included as part of the monitoring circuit is an additional path between $V_{DD}$ and $V_{SS}$ that includes the scaled P-MOSFET 242, the scaled P-MOSFET 243, and the N-MOSFET transistor 236A, all serially connected. The gate of the transistor 242 is connected to the gate-drain of the tail current source 215 and the gate of transistor 243 is connected to the input terminal 220B to be supplied with the input voltage $V_{CM}$+ $\Delta V$. Alternatively it could be connected to input terminal 220A.

To serve as a scaled-down version of the main current the size of tail current sources 232 and 242 are scaled down by a factor of 1/N, or ¼, from the size of transistors 213, 214 and 215, the other tail current sources. As a consequence the current flowing through the current source 232 will be nominal $$\frac{I_0}{N}$$

and also the current flowing through curt source 242 will be nominal $$\frac{I_0}{N}.$$

Similarly the size of transistors 243 and 246 will be scaled down to 1/N the size of the transistors that serve as the main and auxiliary transistors. As a consequence, when the current flowing to the load from the current source 213 is $I_o$ and the current flowing from it to the load is $I_x$, the current flowing through current source 232 into the current mirror will be $I_o/N$ and the current flowing through transistor 243 will be $I_x/N$. This will result in a current flow through transistor 246 equal to $$\frac{I_0}{N} - \frac{I_x}{N},$$

which will bias the current source 214 such as to give rise to a flow of current of $I_o+I_x$ in the auxiliary path to be supplied as the current to the load. This when added to the load current of $I_x$ supplied by the main path will result in the desired $I_o$ total current to the load.

It is to be understood that the specific circuit described is merely illustrative of the general principles involved. Various modifications should be possible in the specific design without departing from the spirit and scope of the invention. In particular, alternative arrangements are feasible for measuring the change in current being supplied to the load by the main differential pair as $V_{CM}$ changes and using the measurement for making compensating changes in the current being supplied to the load by the auxiliary differential pair to keep the total current substantially constant.

What is claimed is:

1. An amplifier comprising:

first and second pairs of transistors, each of like conductivity type and connected as first and second differential amplifiers;

means for applying a first pair of differential signals having a common mode voltage as inputs to the first differential amplifier and a second pair of differential signals equal to the first pair but shifted in d-c level as inputs to the second differential amplifier;

means for combining the outputs of the first and second differential amplifier in a common load;

means for measuring the current through the first differential amplifier as the common mode amplitude of the first pair of differential signals varies; and means for using the measured current to keep substantially constant the total current flow through the first and second differential amplifiers to said load as the common mode voltage of the first pair of differential signals varies.

2. An amplifier in accordance with claim 1 in which the means for applying the second pair of differential signals to the second differential amplifier includes a pair of source followers of the conductivity type opposite said one conductivity type.

3. An amplifier in accordance with claim 1 in which the means for measuring the current through the first differential amplifier includes a third pair of transistors matched to the first pair of transistors and supplied with essentially the same input signals as supplied to the first differential pair.

4. An amplifier in accordance with claim 3 in which the third pair of transistors supplies a current mirror that biases a current source for controlling appropriately the amount of current that flows through the second differential pair to the load.

5. An amplifier in accordance with claim 3 in which the means for applying the second pair of differential signals to the second differential amplifier includes a pair of source follower transistors of the conductivity type opposite the one conductivity type.

6. An amplifier in accordance with claim 1 in which the means for measuring the current through the first differential amplifier comprises means for using a scaled-down version of the current flowing through the first differential pair.

7. An amplifier in accordance with claim 6 in which the means for measuring the current through the first differential amplifier includes transistors that are scaled down in size with respect to the transistors in the first differential amplifiers.

8. An amplifier in accordance with claim 2 in which the means for measuring the current through the first differential amplifier includes transistors that are scaled down in size with respect to the transistors in the first differential amplifier.

9. An amplifier in accordance with claim 6 in which the means for measuring the current through the first differential amplifier supplies a current mirror that biases a current source for controlling appropriately the amount of current that flows through the second differential pair to the load.

10. A method for amplifying a first pair of differential signals comprising the steps of:

applying the first pair of differential signals to a matched pair of transistors of one conductivity type and connected as a first differential amplifier and to a pair of source followers of the opposite conductivity type to derive a second pair of differential signals shifted in d-c level;

applying said second pair of differential signals shifted in d-c level to a second pair of matched transistors of the one conductivity type and connected as a second differential amplifier;

combining the output currents of the first and second differential amplifiers for use in a common load;

measuring the output current in a copy of the first differential amplifier; and using the measured current for controlling the output current of the second differential amplifier for maintaining constant the combined output current to the common load.

11. An amplifier adapted to be supplied with an input pair of differential signals for amplification comprising:

a first pair of matched transistors of one conductivity type connected as a first differential amplifier to be supplied with the input pair of differential signals;

a pair of matched transistors of the opposite conductivity type connected as source followers and supplied with the input pair of differential signals to provide a second pair of differential signals shifted in d-c level;

a second pair of matched transistors of the one conductivity type connected as a second differential amplifier to be supplied with said second differential pair of signals, the output currents of the first and second differential amplifiers being combined for supplying an output load; and a circuit for providing a measure of the output current of the first differential amplifiers for biasing the transistors of the second differential amplifier whereby the combined current to the output load is constant.

12. An amplifier in accordance with claim 11 in which the circuit for copying includes a third pair of transistors of the one conductivity type that are supplied as an input with a signal that is a measure of the first differential signal.

13. An amplifier in accordance with claim 12 that includes a pair of source followers for providing the second pair of differential signals complementary of the first pair to the second pair of matched transistors.

14. An amplifier for amplifying a differential signal comprising:

a first pair of matched transistors of one conductivity type connected as a first differential amplifier adapted to be supplied with a first pair of differential signals having a common mode voltage;

a second pair of matched transistors of the one conductivity type connected as a second differential amplifier adapted to be supplied with a pair of differential signals shifted in d-c level with respect to the first pair for varying the common mode voltage of the amplifier;

means for combining the output currents of the first and second differential amplifiers for supply to a common load;

means for measuring the current through the first differential amplifier as the common mode voltage of the first pair of differential signals varies; and means for using the measured current for varying the current flow through the second differential amplifier for keeping substantially constant the current to the load as the common mode voltage varies.

15. An amplifier for amplifying differential signals comprising:

a first pair of matched transistors of one conductivity type connected as a first differential amplifier adapted to be supplied with a first pair of differential signals;

a second pair of matched transistors of the one conductivity type connected as a second differential amplifier and supplied with the first pair of differential signals shifted in d-c level;

a current-combining circuit that combines the output currents of the first and second differential amplifiers for supply to a load;

a current controller that varies the current flow through the second differential amplifier so as to keep substantially constant the current to the load as the common mode voltage of the first pair of differential signals varies;

a differential amplifier includes both a main differential pair of transistors and an auxiliary differential pair of transistors of like conductivity type that are operated in a voltage-shifted mode with respect to the main differential pair; and a monitoring circuit measures the current to the load from the main pair and varies the current to the load from the auxiliary pair to keep the total current to the load substantially constant as the common-mode amplitude of the input differential signal varies, to increase the effective dynamic range of the differential amplifier.

* * * * *